US010168364B2

(12) United States Patent
Chakrabarty

(10) Patent No.: US 10,168,364 B2
(45) Date of Patent: Jan. 1, 2019

(54) BATTERY MONITORING SYSTEM FOR A VEHICLE AND A METHOD THEREOF

(71) Applicant: Wipro Limited, Bangalore (IN)

(72) Inventor: Rudranil Chakrabarty, Kolkata (IN)

(73) Assignee: WIPRO LIMITED, Bangalore (IN)

( * ) Notice: Subject to any disclaimer, the term of this patent is extended or adjusted under 35 U.S.C. 154(b) by 83 days.

(21) Appl. No.: 15/413,515

(22) Filed: Jan. 24, 2017

(65) Prior Publication Data

US 2018/0149681 A1 May 31, 2018

(30) Foreign Application Priority Data

Nov. 29, 2016 (IN) ............................ 201641040811

(51) Int. Cl.
*G01R 19/165* (2006.01)
*B60R 16/033* (2006.01)
(Continued)

(52) U.S. Cl.
CPC .............. *G01R 19/165* (2013.01); *B60K 1/00* (2013.01); *B60L 1/006* (2013.01); *B60L 1/02* (2013.01);
(Continued)

(58) Field of Classification Search
CPC ................................ G01R 19/165; H02J 7/00
(Continued)

(56) References Cited

U.S. PATENT DOCUMENTS 4,218,717 A 8/1980 Shuster
6,037,749 A 3/2000 Parsonage
(Continued)

FOREIGN PATENT DOCUMENTS

AU 645234 1/1994
JP 3 829379 10/2006

OTHER PUBLICATIONS http://www.continental-corporation.com/www/pressportal_com_em/themes/press_releases/3_automotive_group/chassis_safety/press_releases/pr_2013_06_11_intelligent_battery_sensor_en.html, "Intelligent Sensor by Continental Diminishes Battery-Related Breakdowns", *Continental*, Jun. 11, 2013, 2 pages.
(Continued)

*Primary Examiner* — Rexford Barnie
*Assistant Examiner* — Joseph Inge
(74) *Attorney, Agent, or Firm* — Finnegan, Henderson, Farabow, Garrett & Dunner, LLP

(57) ABSTRACT

The present disclosure discloses a battery source monitoring system for a vehicle. The system comprises at least one current sensor configured to detect current flow from one or more accessory devices connected to an auxiliary battery source. The control unit on detecting vehicle ignition OFF condition, is configured to determine ON condition of one or more accessory devices and switch power source of the one or more accessory devices in ON condition from primary battery source to auxiliary battery source. The control unit then compares current flow received from current sensor with a predetermined threshold. When current flow detected by current sensor surpasses predetermined threshold, the control unit disconnects one or more accessory devices from auxiliary battery source and primary battery source, and switch power source of one or more accessory devices from auxiliary battery source to the primary battery source, thereby monitoring battery source of vehicle.

13 Claims, 5 Drawing Sheets

Engine 112
Primary battery source 110
Auxiliary battery source 111
Chassis 113
Fuse 114
Current sensor 101
Accessory 109₁
Accessory 109₂
Accessory 109ₙ
Control unit 102
User interface 107
109 116 115a₂ 115a₁ 115a 115b 115c 115c₂ 115c₁ 115b₁ 115b₂ 115bₙ 115aₙ 115

(51) Int. Cl.

| | |
|---|---|
| ***G01R 31/36*** | (2006.01) |
| ***H02J 9/00*** | (2006.01) |
| ***H02J 9/06*** | (2006.01) |
| ***B60K 1/00*** | (2006.01) |
| ***B60L 1/00*** | (2006.01) |
| ***B60L 1/02*** | (2006.01) |
| ***B60L 1/14*** | (2006.01) |
| ***B60L 3/00*** | (2006.01) |
| ***B60L 11/18*** | (2006.01) |
| ***B60W 10/06*** | (2006.01) |
| ***B60W 10/26*** | (2006.01) |
| ***B60R 16/03*** | (2006.01) |
| *F02N 11/08* | (2006.01) |

(52) U.S. Cl.
CPC ............... *B60L 1/14* (2013.01); *B60L 3/0046* (2013.01); *B60L 11/1859* (2013.01); *B60L 11/1868* (2013.01); *B60R 16/03* (2013.01); *B60R 16/033* (2013.01); *B60W 10/06* (2013.01); *B60W 10/26* (2013.01); *G01R 31/361* (2013.01); *H02J 9/002* (2013.01); *H02J 9/06* (2013.01); *H02J 9/061* (2013.01); *B60L 2240/549* (2013.01); *F02N 11/0866* (2013.01)

(58) Field of Classification Search
USPC ........................................................... 307/91
See application file for complete search history.

(56) References Cited

U.S. PATENT DOCUMENTS

| | | | | |
|---|---|---|---|---|
| 6,172,643 | B1 | 1/2001 | Toedter | |
| 6,762,513 | B2 * | 7/2004 | Landgraf .................. | H02J 7/14 307/10.6 |
| 7,129,598 | B2 | 10/2006 | Wagner et al. | |
| 8,125,181 | B2 * | 2/2012 | Gregg ................... | B60W 10/26 180/65.29 |
| 2014/0358367 | A1 * | 12/2014 | Copeland ................ | B60R 16/03 701/36 |
| 2016/0111908 | A1 * | 4/2016 | Kwark .................. | H02J 7/0054 320/103 |
| 2016/0303992 | A1 | 10/2016 | Lovett et al. | |

OTHER PUBLICATIONS http://www.hella.com/municipal/assets/media/622_KI_IBS_24V_HELLA_EN.pdf, Brief Information Intelligent battery sensor (BS) 24 V, *Hella*, 2 pages.
Extended European Search Report issued in the European Patent Office in counterpart European Application No. 17159808.9, dated Sep. 21, 2017, 8 pages.

* cited by examiner

BATTERY MONITORING SYSTEM FOR A VEHICLE AND A METHOD THEREOF

TECHNICAL FIELD

The present subject matter is related, in general to power source management in a vehicle, and more particularly, but not exclusively to a system and a method for monitoring battery source of a vehicle for preventing unintentional discharge of power from the battery source to one or more accessory devices of the vehicle.

BACKGROUND

Generally, vehicles are equipped with an on-board power source such as a battery for performing critical vehicle operations including, but are not limited to, starting the vehicle and powering on accessories of the vehicle. The battery source supplies power to an electrical system configured in the vehicle when the power generator of the vehicle such as an alternator is idle or when the power generator is not able to supply power as per the electrical load demand.

It is a common occurrence that, the user or driver may exit the vehicle without switching-OFF one or more accessories of the vehicle. The one or more accessories which are in ON condition drain power from the battery, even when the vehicle ignition is at OFF condition. In such conditions, the battery may be drained completely or may render it to drop below a pre-set voltage which may degrade health of the battery. Such situations may lead the user to be unable to crank the engine using the battery, thereby has to manually crank the engine i.e. by jump-starting the vehicle, which in many scenarios is undesirable.

Conventionally in the art, the battery may be connected to a current or a voltage sensor. The sensor monitors the power remaining in the battery and power utilization/drawn by each of the accessories. A control unit interfaced to this sensor, generates an alert signal to alert the user or driver of the vehicle about battery condition of the vehicle, when the power utilization surpasses a preset limit. This process, therefore enables the user to switch OFF the accessories manually. Further, in some existing technologies the control unit may also switch OFF the accessories which are inadvertently ON during vehicle ignition OFF condition. This process enables to automatically switch OFF the inadvertently ON accessories of the vehicle.

However, power monitoring systems as described hereinabove utilise power from the same battery for which the monitoring needs to be carried out. This configuration of the power monitoring systems results in additional power drain, apart from that of the already connected accessories. Due to the additional power drain, the battery source may not be able to supply current up to the pre-set current limit and therefore the sensor connected to the battery may give out error readings regarding current consumption to the user.

SUMMARY

In one non-limiting embodiment of the present disclosure, a battery source monitoring system for a vehicle is disclosed. The system comprises at least one current sensor configured to detect current flow from one or more accessory devices connected to an auxiliary battery source. A control unit, interfaced to a primary battery source, the auxiliary battery source, the at least one current sensor and an ignition sensor. The control unit on detecting vehicle ignition OFF condition, is configured to determine ON condition of one or more accessory devices and switch power source of the one or more accessory devices in ON condition from the primary battery source to the auxiliary battery source. The control unit then compares the current flow received from the at least one current sensor with a predetermined threshold. When the current flow detected by the at least one current sensor surpasses the predetermined threshold, the control unit disconnects the one or more accessory devices from the auxiliary battery source and the primary battery source, and switch power source of the one or more accessory devices from the auxiliary battery source to the primary battery source, thereby monitoring the battery source of the vehicle.

In another embodiment of the present disclosure, a method for monitoring a battery source of a vehicle is disclosed. The method comprises steps of determining, by a control unit, ON condition of one or more accessory devices. The control unit, switches the power source of the one or more accessory devices in ON condition from the primary battery source to the auxiliary battery source. The control unit, receives the current flow from one or more accessory devices connected to an auxiliary battery source from at least one current sensor. The control unit, compares the current flow with a predetermined threshold. When the current flow detected by the at least one current sensor surpasses the predetermined threshold, the control unit disconnects the one or more accessory devices from the auxiliary battery source and the primary battery source, and switches power source of the one or more accessory devices from the auxiliary battery source to the primary battery source, thereby monitoring the battery source of the vehicle.

In another embodiment of the present disclosure, a control unit for monitoring a battery source of a vehicle is disclosed. The control unit comprises a processing unit and a memory communicatively coupled to the processing unit, wherein the memory stores processor instructions. The control unit upon execution of the processor instructions is configured to determine ON condition of one or more accessory devices and switch power source of the one or more accessory devices in ON condition from the primary battery source to the auxiliary battery source. The control unit, receives current flow through one or more accessory devices connected to an auxiliary battery source from at least one current sensor. The control unit compares the current flow with a predetermined threshold. When the current flow from the at least one current sensor surpasses the predetermined threshold, the control unit disconnects the one or more accessory devices from the auxiliary battery source and the primary battery source, and switches power source of the one or more accessory devices from the auxiliary battery source to the primary battery source, thereby monitoring the battery source of the vehicle.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE ACCOMPANYING FIGURES

The accompanying drawings, which are incorporated in and constitute a part of this disclosure, illustrate exemplary embodiments and, together with the description, serve to explain the disclosed principles. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which:

Figure 1:
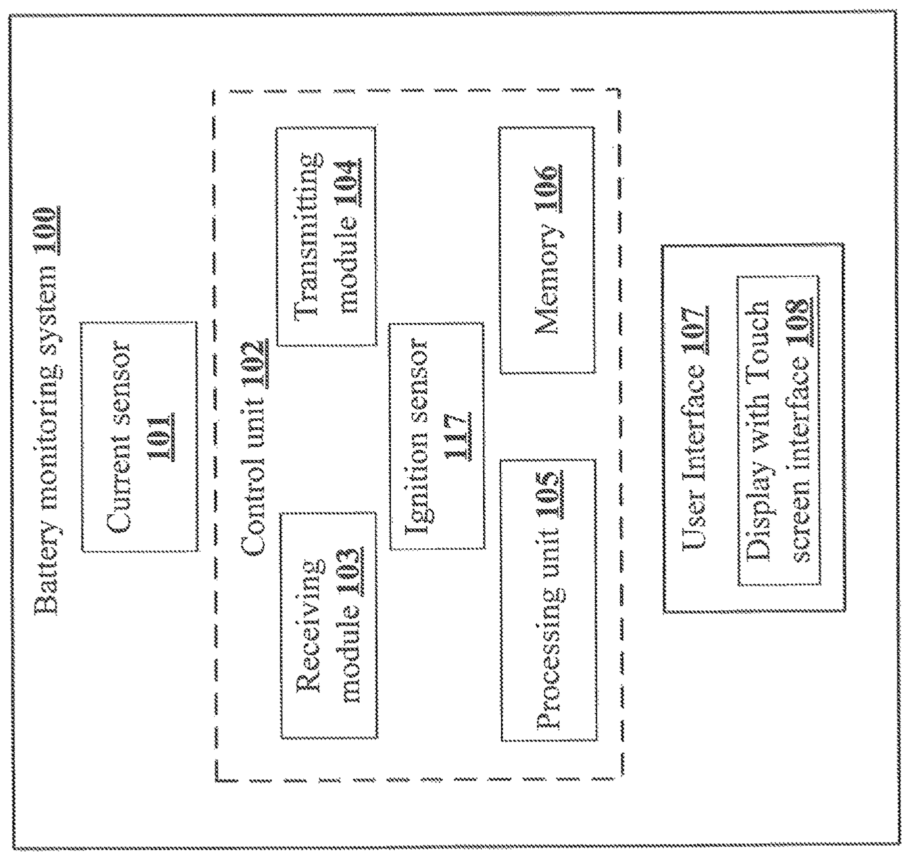
FIG. 1 illustrates block diagram of a battery monitoring system for a vehicle in accordance with some embodiment of the present disclosure.

It should be appreciated by those skilled in the art that any block diagrams herein represent conceptual views of illustrative device embodying the principles of the present subject matter. Similarly, it will be appreciated that any flow charts, flow diagrams, state transition diagrams, and the like represent various processes which may be substantially represented in computer readable medium and executed by a computer or processor, whether or not such computer or processor is explicitly shown.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the spirit and the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

The present disclosure discloses a system and a method for monitoring battery source of a vehicle. The system is configured to switch power source of the one or more accessory devices in ON condition, from a primary battery source to an auxiliary battery source, during vehicle ignition OFF condition.

The battery monitoring system broadly comprises at least one current sensor, a control unit and a user interface. The at least one current sensor may be powered by the auxiliary battery source and is configured to detect current flow from the one or more accessory devices connected to the auxiliary battery source. The control unit is interfaced to the primary battery source, the auxiliary battery source, the at least one current sensor and the ignition sensor for monitoring parameters of the battery source of the vehicle. The control unit is configured with a processing unit and a memory communicatively coupled to the processing unit. The memory stores processor instructions and the data received from other components of the system, for processing of data. The user interface may be associated with the control unit and is configured to receive user preferences for deactivating the one or more accessory devices during vehicle OFF condition. The user interface receives input from the user to select the one or more accessory devices that are to be in OFF condition, at vehicle ignition OFF condition. The user interface notifies the user, the data received by the control unit i.e. the current flow to the one or more de-activated accessory devices.

During battery monitoring process, the control unit determines ON condition of the one or more accessory devices, upon detecting the vehicle ignition OFF condition via the ignition sensor. The one or more accessory devices in ON condition are switched by the control unit from the primary battery source to the auxiliary battery source. The one or more accessory devices are now powered by the auxiliary battery source. The control unit compares the current flow from the auxiliary battery source to the one or more accessory devices with a predetermined threshold. When the current flow from the auxiliary battery source exceeds a predetermined threshold, the control unit is configured to disconnect the one or more accessory devices from the auxiliary battery source and the primary battery source. The term disconnect referred herein above and below, refers to cut-off condition of the power source from the auxiliary battery source. After disconnection, the one or more accessory devices are switched back from the auxiliary battery source to the primary battery source. This configuration enables the one or more accessory devices to be powered by the primary battery source, at vehicle ignition ON condition.

Thus, the battery monitoring system prevents unintentional discharge of power from the battery source to one or more accessory devices of the vehicle. Thereby, monitoring the battery source of the vehicle.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

FIG. 1 illustrates a block diagram of a battery monitoring system 100 for a vehicle, for monitoring of battery source of the vehicle in some embodiment of the present disclosure.

In an exemplary implementation as shown in FIG. 1, the battery monitoring system 100 broadly comprises at least one current sensor 101, a control unit 102 and a user interface 107.

The at least one current sensor 101 may be provisioned as a detection unit in the system 100 and is powered by an auxiliary battery source 111. The at least one current sensor 101 is configured for detection of current flowing [or current consumption] through one or more accessory devices 109 of the vehicle connected to the auxiliary battery source 111. The data detected by the at least one current sensor 101, is received by the control unit 102 in real time. In an exemplary embodiment, the at least one current sensor 101 may be a hall-effect sensor. In some embodiment, the at least one current sensor 101 may also detect current drawn from a primary battery source 110 of the vehicle.

As shown in FIG. 1, the user interface 107 includes a display with touch screen interface 108. The display with touch screen interface 108 may be configured to receive one or more inputs from the user. In some embodiment, the inputs from the user includes selecting the one or more accessory devices 109 to be in OFF condition, at vehicle ignition OFF condition. In another embodiment, the inputs from the user includes selecting the one or more accessory devices 109 to be in ON condition, at vehicle ignition OFF condition. In some embodiment, the inputs from the user includes a pre-configured data related to the battery source of the vehicle, for example, current drain limit from the auxiliary battery source 111 amounting to 9V, 12V, 16V and the like. In an embodiment, the display with touch screen interface 108 may be used to display the current consumption of each of the one or more accessory devices 109 connected to the auxiliary battery source 111. The information may include the total current consumption of each of the one or more accessory devices 109 and current remaining in the auxiliary battery source 111. In some embodiment, the information may include the total voltage/power consumption of each of the one or more accessory devices 109 and voltage/power remaining in the auxiliary battery source 111. In an exemplary embodiment, the user interface 107 can be at least one of mobile phone or mobile communication unit, which enables the user to provide inputs remotely.

In some embodiment, the control unit 102 is interfaced to the at least one current sensor 101, the primary battery source 110, the auxiliary battery source 111, the user interface 107, the one or more accessory devices 109 and an ignition sensor 117 of the vehicle, for real-time monitoring of battery source of the vehicle. The control unit 102 may include, but not limiting to, a receiving module 103, a transmitting module 104, a processing unit 105 and a memory 106. The receiving module 103 may be communicatively coupled to the other modules, for receiving electrical signals. The control unit 102 may include a determination unit [not shown] for determining the status of each of the modules connected to the control unit 102. The control unit 102, may also include an activation unit [not shown] for activating the control unit 102, based on electrical signals received from the components interfaced to the control unit 102. In some embodiment, the control unit 102 may be activated through the activation unit upon receipt of electrical signals from other modules. In an exemplary embodiment, the control unit 102 may be activated upon determining the vehicle ignition OFF condition via the ignition sensor 117. Further, when the one or more accessory devices 109 is in ON condition, at vehicle ignition OFF condition, the electrical signals received by the control unit 102 are processed by the processing unit 105.

As shown in FIG. 1, the control unit 102 is interfaced to a memory 106 to retrieve data stored in the memory 106 for processing the electrical signals via the processing unit 105. In some embodiment, the data stored in the memory 106 includes pre-configured data of the battery source, for example current/power drain limit from the primary battery source 110 and/or the auxiliary battery source 111. In some embodiment, the memory 106 stores data pertaining to processing steps that the control unit 102 performs via the processing unit 105 upon receiving data from other modules. In some embodiment, the data may be stored in the memory 106 in the form of various data structures. Additionally, the data can be organized using data models, such as, relational or hierarchical data models. Other data may also be stored including temporary data and temporary files, generated by modules for performing the various functions of the battery monitoring system 100. The data processed by the control unit 102 may be transmitted to other modules or components of the system 100, for monitoring the battery sources. In an exemplary embodiment, the control unit 102 compares the current flow through the one or more accessory devices 109 with a predetermined threshold stored in the memory 106. Based on the comparison, the control unit 102 transmits an electrical signal appropriately for monitoring battery sources.

In an embodiment, the system 100 may include a communication interface [not shown] for receiving and transmitting electrical signals from the control unit 102. In an embodiment, the communication interface may include, but not limited to, a wireless communication technique such as, Bluetooth, Near Field Communication (NFC) and Wi-Fi. In an exemplary embodiment, the communication interface may provide signals to plurality of switching circuits 115 for performing one or more actions such as switch power source of the one or more accessory devices 109 from the primary battery source 110 to auxiliary battery source 111, disconnect power source of the one or more accessory devices 109 and switch power source of one or more accessory devices 109 from auxiliary battery source 111 to the primary battery source 110.

Figure 2:
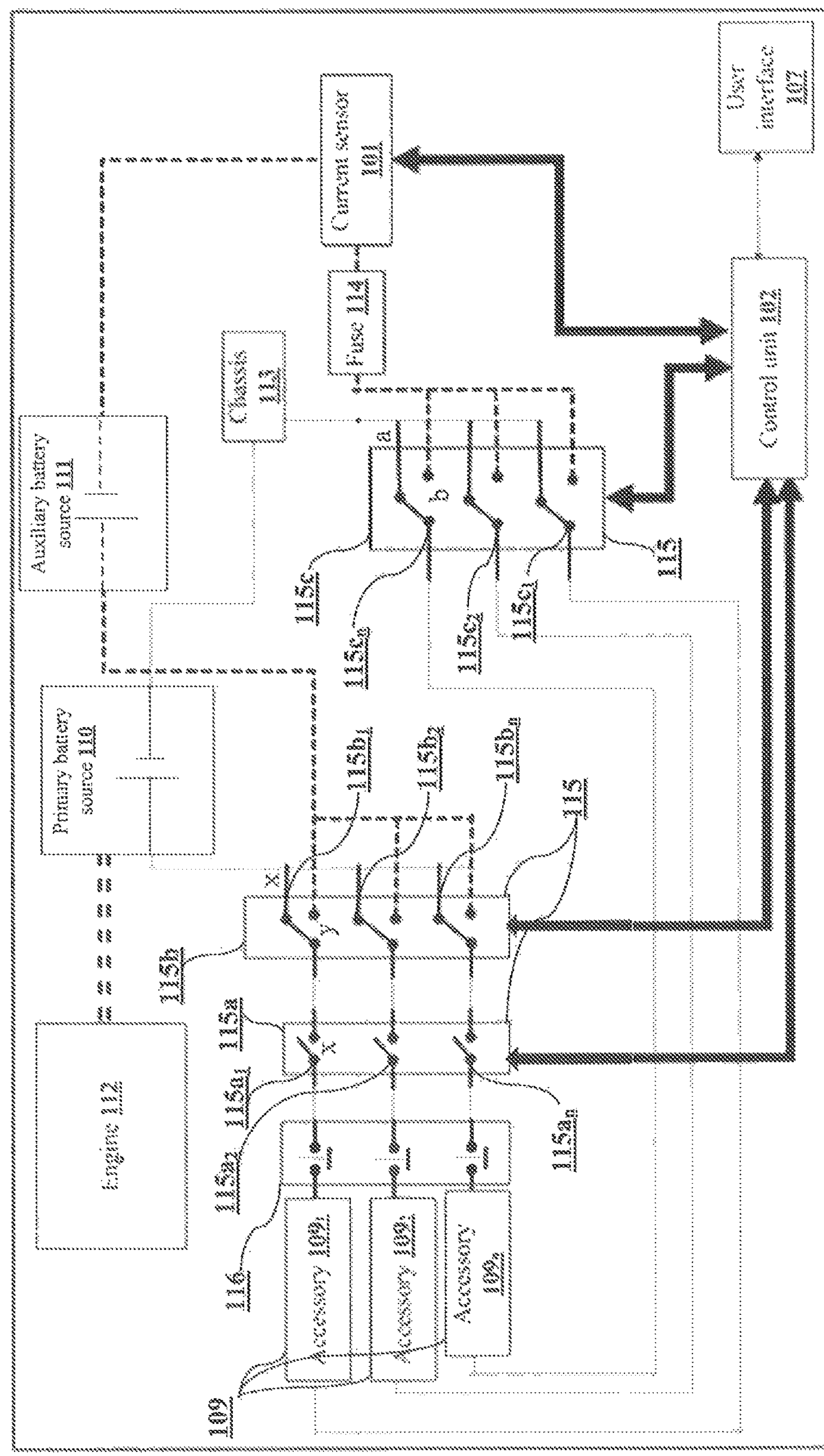
FIG. 2 illustrates a schematic representation of the battery monitoring system for the vehicle in accordance with some embodiment of the present disclosure.

FIG. 2 illustrates a schematic representation of the battery monitoring system 100 for a vehicle, in accordance with some embodiment of the present disclosure.

Figure 3:
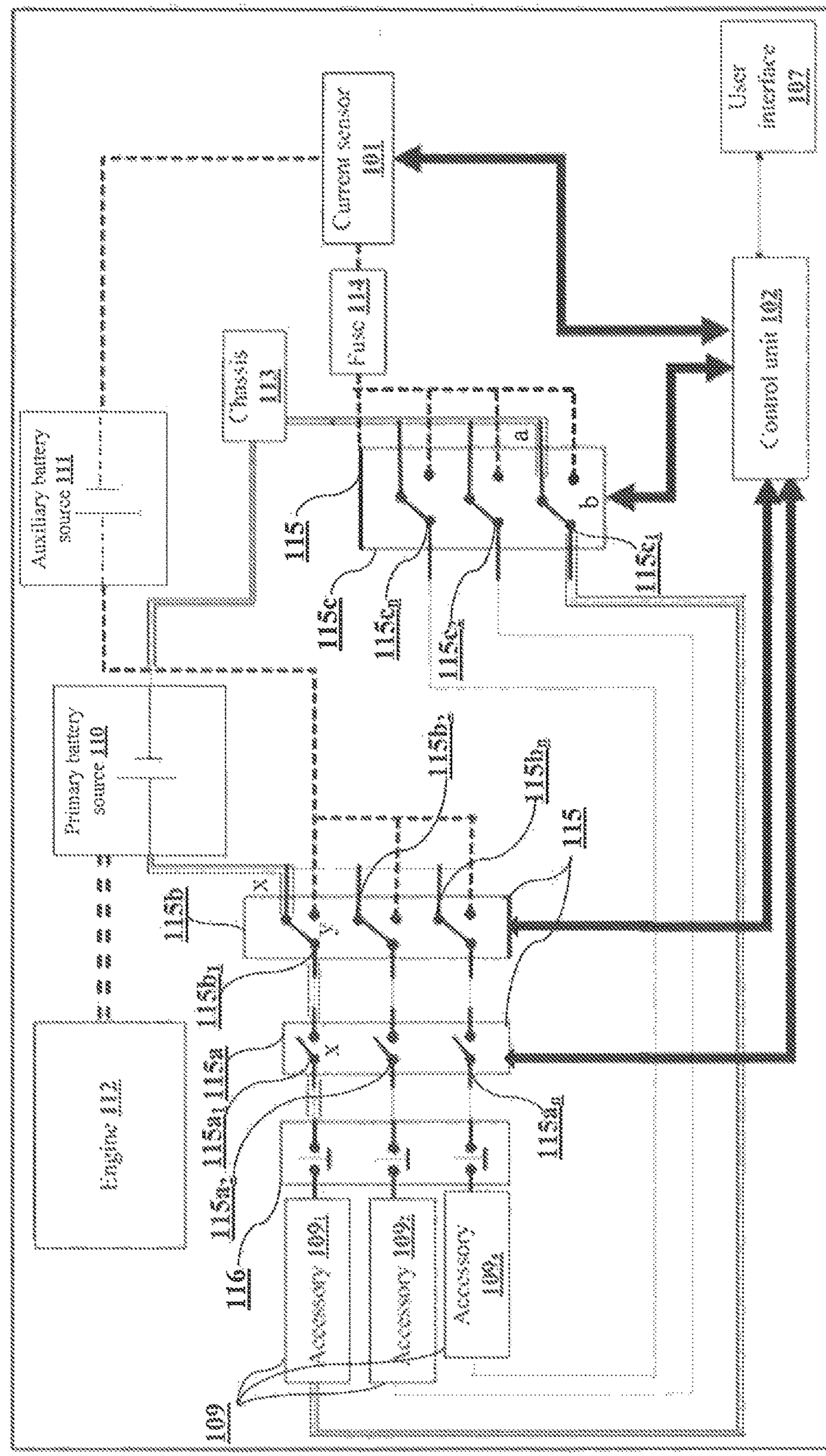
FIG. 3 illustrates a schematic representation of one or more accessory devices of the vehicle connected to a primary battery source in accordance with some embodiment of the present disclosure.

The battery monitoring system 100 comprises the primary battery source 110 coupled to an engine 112 and to one or more accessory devices 109 of the vehicle. The primary battery source 110 is configured to supply current to a starter motor [not shown] for cranking the engine 112. The primary battery source 110 also supplies current to the one or more accessory devices 109 which is selected by the user, when the engine 112 or an alternator is in operation [as shown in FIG. 3]. The one or more accessory devices 109 include, but are not limited to, headlamp, cabin lights, radio. GPS navigation system, alarm system and the like. The engine 112, during operation, simultaneously charges the primary battery source 110, thereby compensating the current drain from the primary battery source 110. In an embodiment, the primary battery source 110 may be a rechargeable battery such as, but not limited to, lead battery, lead alkaline battery and the like. In an embodiment, the one or more accessory devices 109 are connected such that, a positive terminal [not shown] of the one or more accessory devices 109 is connected to a positive terminal of the primary battery source 110 and a negative terminal of the one or more accessory devices 109 is connected to a chassis 113 of the vehicle.

As shown in FIG. 2, the system 100 includes the auxiliary battery source 111 connected to the at least one current sensor 102, for selectively powering the one or more accessory devices 109.

A plurality of switching circuits 115 are configured in-between each of the one or more accessory devices 109, the primary battery source 110 and the auxiliary battery source 111. The plurality of switching circuits 115 are controlled by the control unit 102 to enable selective switching between battery sources. In an embodiment, the battery sources/ power source comprise the primary battery source 110 and the auxiliary battery source 111. In some embodiment, for the one or more accessory devices $\mathbf{109}_1$, the plurality of switching circuits are $\mathbf{115}a_1$, $\mathbf{115}b_1$ and $\mathbf{115}c_1$. Similarly, for the one or more accessory devices $\mathbf{109}_n$, the plurality of switching circuits are $\mathbf{115}a_n$, $\mathbf{115}b_n$ and $\mathbf{115}c_n$. In an embodiment, the plurality of switching circuits 115 required for selective switching of power sources per accessory may be three, which helps in switching of the power sources and simultaneously prevent supply of current to the one or more accessory devices 109. Each of the plurality of switching circuits 115 are configured with a two-way current line to enable switching between the primary battery source 110 and the auxiliary battery source 111 [illustrated as x, y and a, b]. For example, when a switch of one or more accessory devices 109 is at 'x' and at 'a' position, then the one or more accessory devices 109 are connected to the primary battery source 110. Similarly, when switch of the one or more accessory devices 109 is at 'y' and at 'b' position, then the one or more accessory devices 109 are connected to the auxiliary battery source 111. In an embodiment, a manual switch 116 may be configured to manually switch the one or more accessory devices 109 between the primary battery source 110 and the auxiliary battery source 111. A fuse 114 may be provisioned in current supply line, as a safety measure during switching between the primary battery source 110 and the auxiliary battery source 111. The fuse 114 also acts as a cut-off power supply when the current supply demand from the auxiliary power source 111, is surged.

Figure 4:
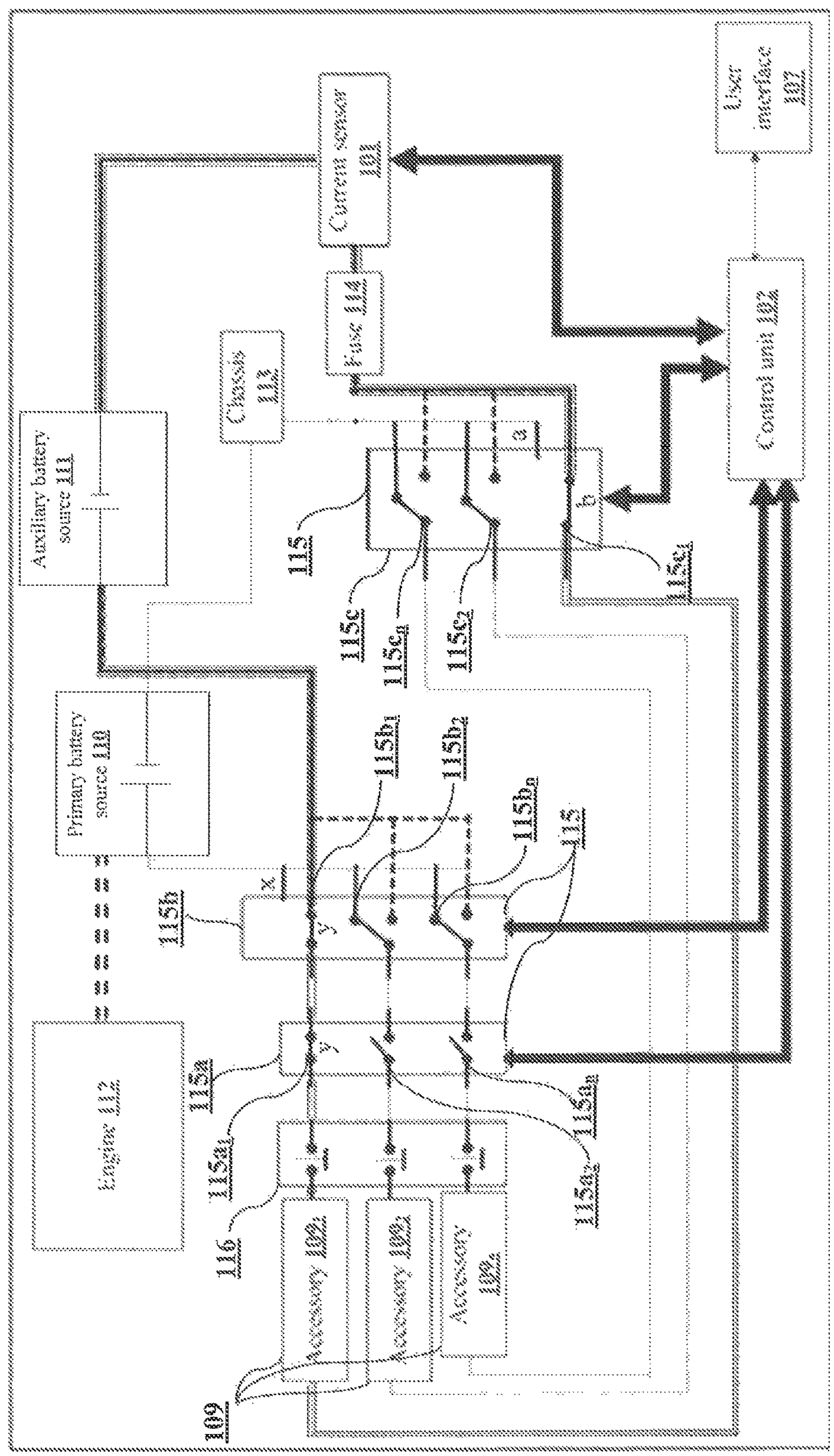
FIG. 4 illustrates a schematic representation of the one or more accessory devices of the vehicle connected to an auxiliary battery source in accordance with some embodiment of the present disclosure.

FIG. 4 illustrates schematic representation of the battery monitoring system 100, wherein the one or more accessory devices 109 are connected to the auxiliary power source 110, in accordance with some embodiment of the present disclosure. The battery monitoring system 100, is configured such that, at vehicle ignition OFF condition, the control unit 102 switches the power source of the one or more accessory devices 109 from the primary battery source 110 to the auxiliary battery source 111. In an embodiment, switching of the power source is carried out such that, the positive terminal of the auxiliary battery source 111 is connected to the positive terminal of the one or more accessory devices 109 and the negative terminal of the one or more accessory devices 109 is connected to the fuse 114.

As shown in FIG. 4, the plurality of switching circuits 115 are operated to their respective positions for supplying current from the auxiliary battery source 111. For example, accessory $\mathbf{109}_1$ of the one or more accessory devices 109, the plurality of switches $\mathbf{115}a_1$, $\mathbf{115}b_1$ and $\mathbf{115}c_1$ are operated to positions 'y', 'y' and 'b' respectively. The auxiliary battery source 111, powers the one or more accessory devices 109, until the current drawn from the auxiliary battery source 111 exceeds a predetermined threshold. Thereby enabling the user to operate the required one or more accessory devices 109, until the current drawn from the auxiliary battery source 111 exceeds a predetermined threshold.

Figure 5:
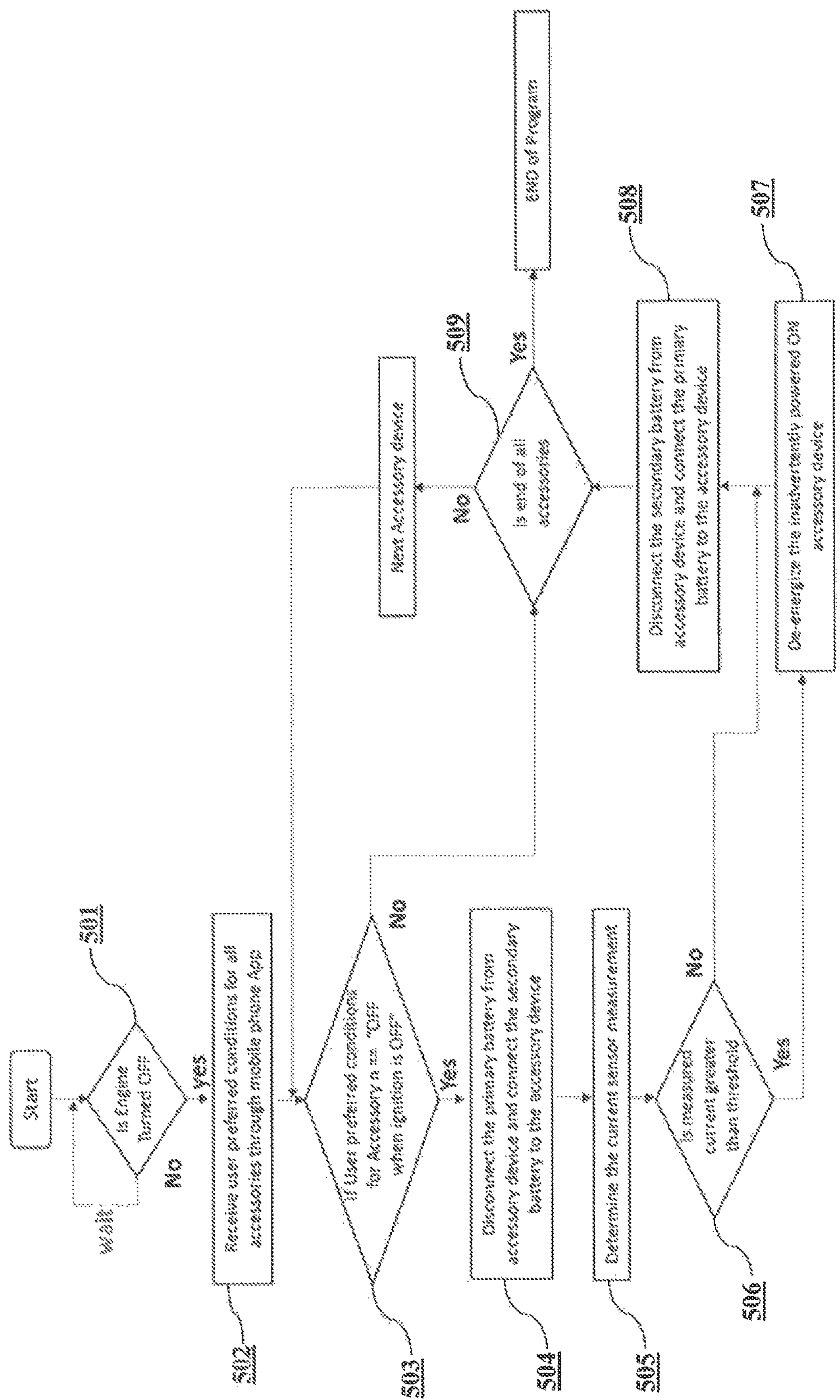
FIG. 5 illustrates flow chart of the process of monitoring the battery source of the vehicle in accordance with some embodiment of the present disclosure.

FIG. 5 illustrates a flow chart of process of monitoring the battery sources of the vehicle, in one exemplary embodiment of the present disclosure.

At step 501, the control unit 102 may determine whether the vehicle is at the vehicle ignition OFF condition or at the vehicle ignition ON condition. In an embodiment, the control unit 102 determines the vehicle ignition OFF condition by the ignition sensor 116. In some embodiment, the vehicle ignition OFF condition is determined by monitoring the engine 112 operating parameters such as, but not limited to, rotation per minute (rpm) of the engine 112 and the like. At vehicle ignition ON condition, the one or more accessory devices 109 are all connected and powered by the primary battery source 110 [as shown in FIG. 3]. At the vehicle ignition OFF condition, the control unit 102 proceeds to step 502.

In step 502, the user interface 107 receives user preferences, as to which of the one or more accessory devices 109 of the vehicle is to be in OFF condition at vehicle ignition OFF condition. On receiving the user preferences, the control unit 102 proceeds to step 503.

In step 503, the control unit 102 may monitor only the one or more accessory devices 109, selected by the user to be in OFF condition, but, the selected one of the one or more accessory devices 109 was left in ON condition inadvertently by the user. Thus, when the one or more accessory devices 109 selected by the user is not in ON condition [i.e. OFF condition], then the control unit 102, proceeds to step 509 and begins to monitor from the next cycle of operation. If any of the one or more accessory devices 109 was left in ON condition [i.e. in inadvertently ON condition], when the vehicle ignition is at OFF condition and the user has selected that one or more accessory devices 109 to be in OFF condition during the vehicle ignition OFF condition, the control unit 102, proceeds to step 504. Further, the one or more accessory devices 109 [shown in FIGS. 2, 3, 4] not selected by the user will be powered by the primary battery source 110. Thus, if the battery drains below a predetermined threshold, then the control unit 102, proceeds to step 504 considering the power drain from the one or more accessory devices 109.

In step 504, the control unit 102 switches the power source of the one or more accessory devices 109 that are in ON condition from the primary battery source 110 to the auxiliary battery source 111 [as shown in FIG. 4] via the plurality of switching circuits 115. For example, as seen in FIG. 4, for the one or more accessory device $\mathbf{109}_1$, the plurality of switching circuits $\mathbf{115}a_1$, $\mathbf{115}b_1$ and $\mathbf{115}c_1$ are operated by the control unit 102 from 'x', 'x', and 'a' positions to 'y', 'y' and 'b' positions respectively, thereby switching the power source from the primary battery source 110 to the auxiliary battery source 111. The one or more accessory device $\mathbf{109}_1$, therefore draws current from the auxiliary battery source 111 instead of the primary battery source 110. In this condition, the control unit 102, proceeds to step 505.

In step 505, the control unit 102 receives the current drawn through the one or more accessory devices 109 connected to the auxiliary battery source 111, via the at least one current sensor 101. On receipt of the current drawn from the at least one current sensor 101, the control unit 102 proceeds to step 506.

In step 506, the value received by the control unit 102, is compared with the data stored in the memory 106. If the value detected by the at least one current sensor 101 is greater than or equal to the predetermined threshold stored in the memory 106, the control unit 102 proceeds to the subsequent step 507. For example, if the predetermined threshold set in the memory 106 is 12V, and the value detected by the at least one current sensor 101 is 14V, then the control unit 102 proceeds to step 507. In some embodiment, if the value detected by the at least one current sensor 101 is lesser than the predetermined threshold stored in the memory 106, that one or more accessory devices 109 is retained in ON condition. For example, if the predetermined threshold set in the memory 106 is 12V, and the value detected by the at least one current sensor 101 is 10V, then that one or more accessory devices 109 are retained in ON condition.

In step 507, the control unit 102, disconnects the one or more accessory devices 109 connected to the auxiliary battery source 111 and proceeds to step 508.

In step 508, the one or more de-activated accessory devices 109 are switched to the primary battery source 110. Thus, in steps 507 and 508, the one or more accessory devices 109 are completely disconnected from the power sources, and therefore, no current is drawn by any of the one or more accessory devices 109. The switching of the one or more accessory devices 109 to the primary battery source 110 enables the one or more accessory devices 109 to be powered by the primary battery source 110, when the user toggles to vehicle ignition ON condition. After step 508, at step 509 the control unit 102 reconfirms whether all the one or more accessories 109 are monitored.

In an embodiment, the present disclosure provides a system for monitoring battery sources of the vehicle, thereby preventing drain of the primary battery source of the vehicle.

In an embodiment, the present disclosure provides a system which uses an auxiliary battery source for detecting current drawn by each of the one or more accessory devices of the vehicle, thereby enables accurate readings of the current consumption for each the one or more accessory devices.

In an embodiment, the present disclosure provides a system which uses the auxiliary battery source for connecting to the current sensor, thereby preventing battery drain of the primary battery source of the vehicle.

In an embodiment, the present disclosure provides a system wherein the one or more accessory devices which are to be in OFF condition at vehicle ignition OFF condition are grouped, so that the current measurement data is minimal.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

A description of an embodiment with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

Referral Numerals

| Referral Numerals | Description |
|---|---|
| 100 | Battery monitoring system |
| 101 | Current sensor |
| 102 | Control unit |
| 103 | Receiving module |
| 104 | Transmitting module |
| 105 | Processing unit |
| 106 | Memory |
| 107 | User interface |
| 108 | Display with touch screen interface |
| 109 and $109_1$-$109_n$ | One or more accessory devices |
| 110 | Primary battery source |
| 111 | Auxiliary battery source |
| 112 | Engine |
| 113 | Chassis |
| 114 | Fuse |
| 115, $115_a$, $115_b$, $115_c$, $115_{a1}$-$115_{an}$, $115_{b1}$-$115_{bn}$ and $115_{c1}$-$115_{cn}$ | Plurality of switching circuits |
| 116 | Manual switch |
| 117 | Ignition sensor |
| 501-508 | Process steps |

What is claimed is:

1. A battery source monitoring system for a vehicle, the system comprising:
   - a plurality of switching circuits, each switching circuit with a two-way current line to enable switching of one or more accessory devices between a primary battery source and an auxiliary battery source;
   - at least one current sensor configured to detect current consumption of the one or more accessory devices connected to an auxiliary battery source; and
   - a control unit, interfaced to the plurality of switching circuits, the primary battery source, the auxiliary battery source, the at least one current sensor and an ignition sensor, on detecting vehicle ignition OFF condition, is configured to:
     - determine ON condition of the one or more accessory devices;
     - switch power source of the one or more accessory devices in ON condition from the primary battery source to the auxiliary battery source;
     - comparing current consumption of each accessory device with a predetermined threshold; and
     - when the current consumption of a first accessory device surpasses the predetermined threshold, control the plurality of switching circuits to:
       - disconnect the first accessory device from the auxiliary battery source by switching power source of the first accessory device from the auxiliary battery source to the primary battery source; and selectively power the remaining accessory devices and the at least one current sensor by the auxiliary battery source simultaneously, thereby monitoring the battery source of the vehicle.

2. The system as claimed in claim 1, wherein the at least one current sensor is powered by the auxiliary battery source.

3. The system as claimed in claim 1, wherein the one or more accessory devices are powered by the primary battery source at vehicle ignition ON condition.

4. The system as claimed in claim 1 further comprising a user interface to receive user preferences for deactivating the one or more accessory devices during the vehicle ignition OFF condition.

5. The system as claimed in claim 4, wherein the one or more de-activated accessory devices are preferred by the user to be in OFF condition during vehicle ignition OFF condition.

6. The system as claimed in claim 4, wherein the user interface is configured to notify a user about the current flow to the one or more de-activated accessory devices connected to the auxiliary battery source.

7. A method for monitoring a battery source of a vehicle, the method comprising:

determining, by a control unit, ON condition of one or more accessory devices when vehicle ignition is in OFF condition;

switching, by the control unit, power source of the one or more accessory devices in ON condition from a primary battery source to an auxiliary battery source, wherein switching of the one or more accessory devices between the primary battery source and the auxiliary battery source is performed using a plurality of switching circuits, each switching circuit with a two-way current line;

receiving, by the control unit, current consumption of the one or more accessory devices connected to the auxiliary battery source from at least one current sensor;

comparing, by the control unit, the current consumption of each accessory device with a predetermined threshold; and controlling the plurality of switching circuits, by the control unit, when the current consumption of a first accessory device surpasses the predetermined threshold, wherein controlling the plurality of switching circuits comprises:

disconnecting the first accessory devices from the auxiliary battery source by switching power source of the first accessory device from the auxiliary battery source to the primary battery source; and selectively powering the remaining accessory devices and the at least one current sensor by the auxiliary battery source simultaneously, thereby monitoring the battery source of the vehicle.

8. The method as claimed in claim 7, wherein the at least one current sensor is powered by the auxiliary power source.

9. The method as claimed in claim 7 further comprising receiving, by a user interface, user preferences for deactivating one or more accessory devices during the vehicle ignition OFF condition.

10. The method as claimed in claim 9 further comprising powering the one or more de-activated accessory devices by the primary battery source at vehicle ignition ON condition.

11. The method as claimed in claim 9 further comprising providing a notification on the user interface about the current flow to the one or more de-activated accessory devices connected to the auxiliary battery source.

12. A control unit for monitoring a battery source of a vehicle, comprising:

a processing unit; and a memory communicatively coupled to the processing unit, wherein the memory stores processor instructions, which, on execution, causes the processing unit to:

determine ON condition of one or more accessory devices when vehicle ignition is in OFF condition;

switch power source of the one or more accessory devices in ON condition from a primary battery source to an auxiliary battery source, wherein switching of the one or more accessory devices between the primary battery source and the auxiliary battery source is performed using a plurality of switching circuits, each switching circuit with a two-way current line;

receive current consumption of the one or more accessory devices connected to the auxiliary battery source from at least one current sensor;

compare the current consumption of each accessory device with a predetermined threshold; and control the plurality of switching circuits, by the control unit, when the current consumption of a first accessory device surpasses the predetermined threshold, wherein controlling the plurality of switching circuits is to:

disconnect the first accessory device from the auxiliary battery source by switching power source of the first accessory device from the auxiliary battery source to the primary battery source; and selectively power the remaining accessory devices and the at least one current sensor by the auxiliary battery source simultaneously, thereby monitoring the battery source of the vehicle.

13. The control unit as claimed in claim 12, wherein the one or more accessory devices are powered by the primary battery source at vehicle ignition ON condition.

* * * * *